United States Patent [19]

Furuta et al.

[11] 4,218,764
[45] Aug. 19, 1980

[54] NON-VOLATILE MEMORY REFRESH CONTROL CIRCUIT

[75] Inventors: Yukio Furuta, Kusatsu; Tomisaburo Okumura, Kyoto, both of Japan

[73] Assignee: Matsushita Electric Industrial Co., Ltd., Kadoma, Japan

[21] Appl. No.: 948,335

[22] Filed: Oct. 3, 1978

[51] Int. Cl.² ............................................... G11C 7/00
[52] U.S. Cl. ..................................... 365/222; 365/228
[58] Field of Search ....................... 365/226, 228, 222

[56] References Cited

U.S. PATENT DOCUMENTS

| | | | |
|---|---|---|---|
| 3,761,901 | 9/1973 | Aneshansley | 365/228 |
| 3,771,148 | 11/1973 | Aneshansley | 365/228 |
| 3,796,998 | 3/1974 | Appelt | 365/222 |

OTHER PUBLICATIONS

Johnson, Self-Actuating Refresh Scheme for Dynamic Memories, IBM Tech. Disc. Bul., vol. 20, No. 11A, 4/78, pp. 4399-4400.

Shattuck et al., Memory Protection System, IBM Tech. Disc. Bul., vol. 9, No. 6, 11/66, pp. 731-734.

Primary Examiner—Stuart N. Hecker
Attorney, Agent, or Firm—Cushman, Darby & Cushman

[57] ABSTRACT

A non-volatile memory control circuit for reprogramming non-volatile memory devices before their natural decay causes their "1" and "0" levels to become indistinguishable. Signals representing the memory states of the non-volatile memory devices are temporarily stored while the non-volatile memory devices are erased. After erasure the memory states are rewritten into the non-volatile memory devices. After rewriting, the control circuit is automatically reset. The erase/write operation is triggered by interrogating a second set of "parallel" non-volatile memory devices containing a predetermined data pattern, the interrogation occurring with a threshold detection level greater than that at which the memory levels of the primary non-volatile devices become indistinguishable.

16 Claims, 18 Drawing Figures

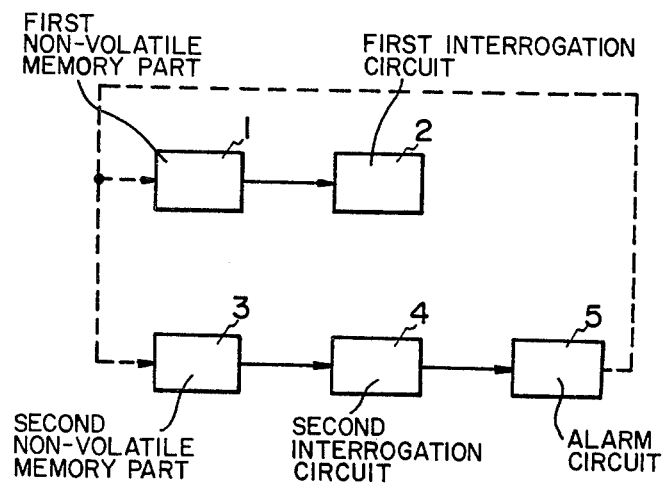
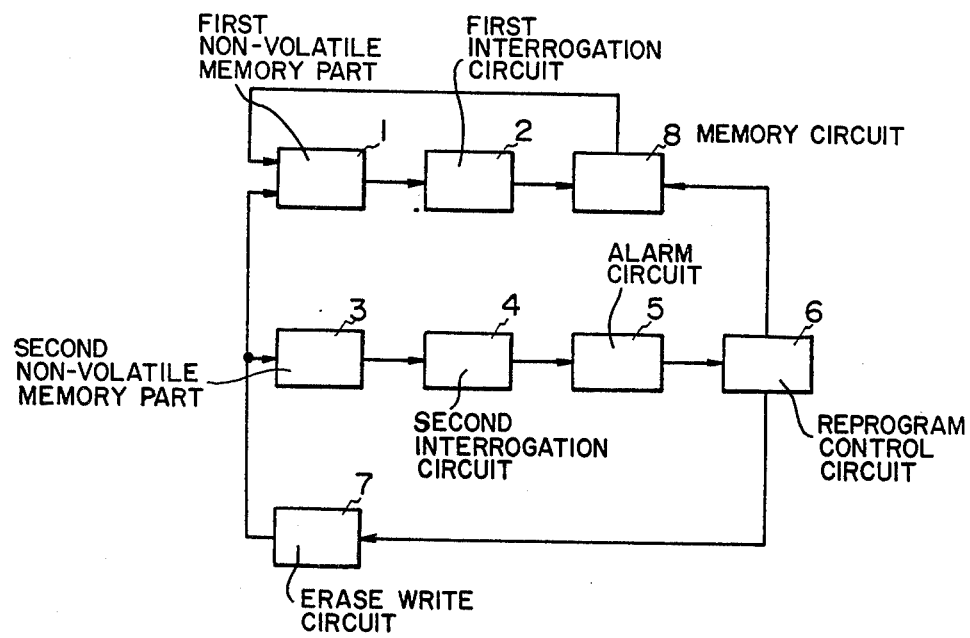

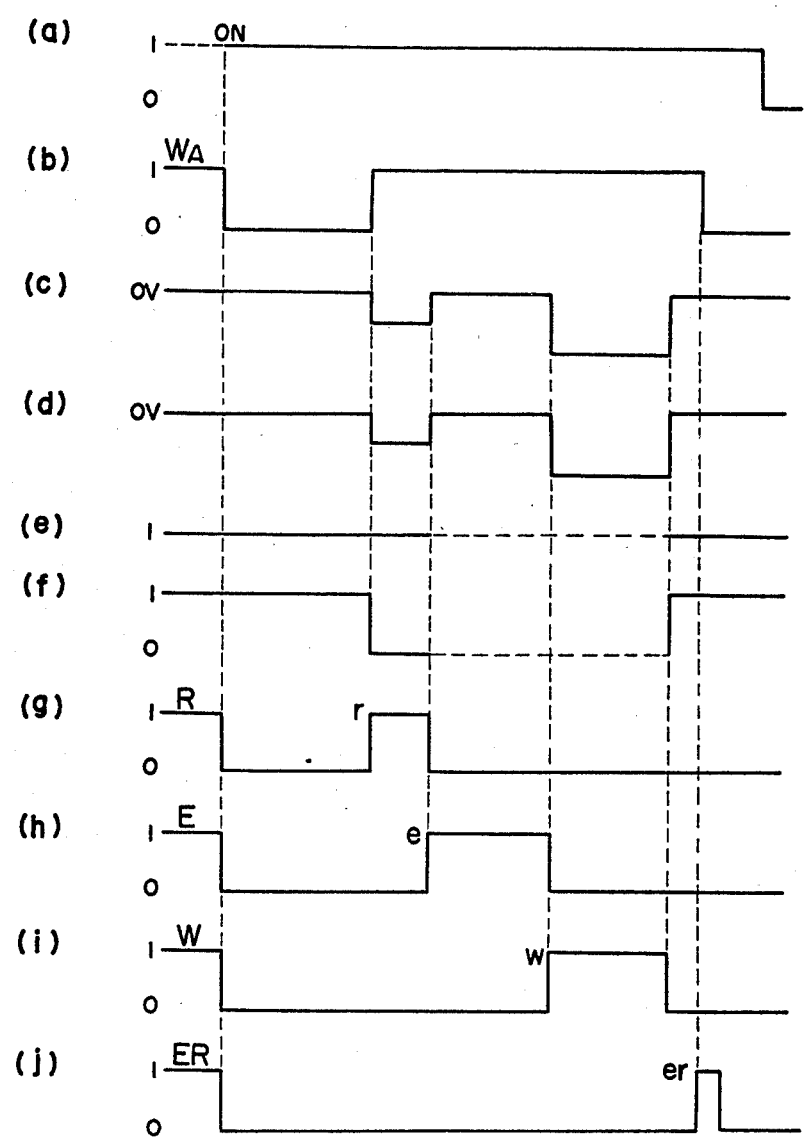

NON-VOLATILE MEMORY REFRESH CONTROL CIRCUIT

BACKGROUND OF THE INVENTION

Field of the Technology

This invention relates to a non-volotile memory control circuit which drastically improves reliability of memory retention of a non-volatile memory device.

Background

A non-volatile memory device is now well known as a circuit element which retains memory contents semi-permanently. In fact, it is not avoidable that memory states gradually change as time passes. The non-volatile memory devices of semiconductor are largely classified into the following three groups:

(i) ROM . . . read only memory, wherein logic levels are fixed during the masking process and once data are programmed, reprogramming is not possible, (ii) EPROM . . . erasable programmable ROM, wherein data can be electrically programmed, but data can only be erased by X-ray or ultraviolet light (UV), (iii) EAROM . . . electrically alterable ROM, wherein information is introduced by selectively programming "1"s in proper bit locations and the bit pattern can be erased later and a new pattern can then be written into the devices.

For the non-volatile memory devices grouped in (i), there are a mask ROM and a fuse ROM. In these memory devices, once the data are programmed, they can not be reprogrammed, and accordingly there arises no problems in practical use even if memory states change as time passes. On the contrary, in the non-volatile memory devices where data information can be reprogrammed, there arise grave problems in practical use when the memory states change as time passes.

This inconvenience is explained referring to FIG. 1, which shows relationship between memory level (M) for example, electric potential or magnetic potential, and time lapse (T). The memory level shown by a curve M1 indicates a memory state 1 (hereinafter written "1"), and the memory level shown by a curve M0 indicates a memory state 0 (hereinafter written "0"). The memory levels for "1" and "0" have their initial values M10 and M00 (at T0), respectively, and slowly change as time passes as shown in FIG. 1. They reach M11 and M01 at T1, and reach M12 and M02 at T2, respectively.

Theoretically speaking, it is possible to distinguish between "1" and "0", if the memory level M1 for "1" and the memory level for "0" satisfy the relationship $|M1-M0|>0$. But this is only theoretical relation, and in practice accuracies of an interrogation circuit or the like used must be taken into account. Accordingly, specified difference $\Delta M$ is required between the memory level M1 for "1" and the memory level M0 for "0". This means, distinction between "1" and "0" is surely possible when the relation $|M1-M0| \geq \Delta M$ holds for the memory levels M1 and M0, where the difference $\Delta M$ is a positive and finite value.

For the characteristics of a non-volatile memory device, the longer the time period from a writing to the time for the memory level difference becoming to the value $\Delta M$ is, and also the smaller the minimum value of the memory level difference $\Delta M$ required for an accurate reading of "1" and "0" is, the longer the time of memory retention becomes.

In actual memory devices, as far as the memory levels M1 and M0 change as time passes shown in FIG. 1, a maximum memory retention time becomes a finite one. For example, if a difference $\Delta M(2)$ at T2 is equal to the threshold value of the difference of the memory levels $\Delta M$ which is necessary to distinguish between "1" and "0", then we can define T2 as the memory retention time of the non-volatile memory devices. Accordingly, if the memorized memory levels can be reprogrammed before the quantity $|M1-M0|$ decreases to the threshold value $\Delta M(2)$, the valid memory states can be continuously retained.

SUMMARY OF THE INVENTION

The present invention provides a non-volatile memory control circuit, wherein memorized states of non-volatile memory devices can be semipermanently kept in valid states, and accordingly condition of circuits including non-volatile memory devices is kept in right circuit condition.

BRIEF EXPLANATION OF THE DRAWINGS

FIG. 3 to FIG. 5 are block diagrams of non-volatile memory control circuits for non-volatile memory devices in accordance with the present invention.

FIG. 8 (a) to FIG. 8 (j) are timing charts showing voltage of various parts of the circuit shown in FIG. 6.

DETAILED DESCRIPTION OF THE INVENTION

Figure 1:
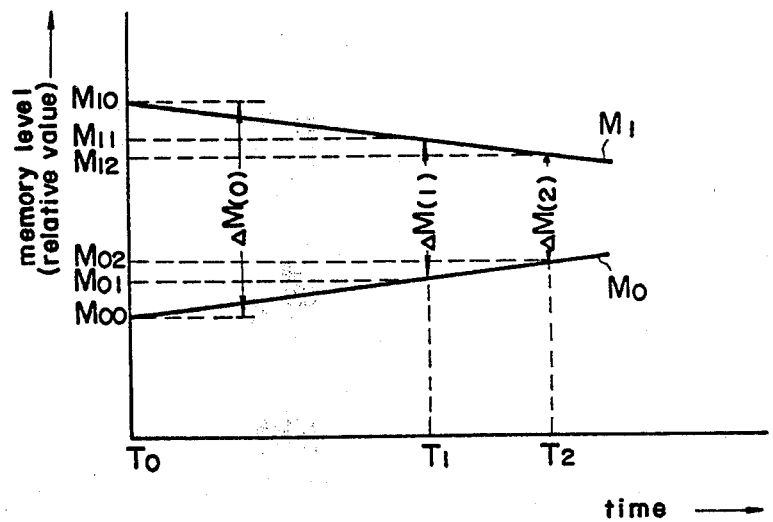
FIG. 1 is a time chart showing one example of change of memory levels in a non-volatile memory device for the passage of time.

The feature of the present invention is to provide a non-volatile memory control circuit for the non-volatile memory devices, wherein an interrogation circuit having a preset reference voltage corresponding to the difference $\Delta M(1)$ of the memory level at a time T1, which is prior to a time T2 as shown in FIG. 1, is provided, and the memory levels of the non-volatile memory devices are reprogrammed before the difference decreases to the threshold value $\Delta M(2)$ at the time T2, by utilizing the output signal of the interrogation circuit.

Figure 2:
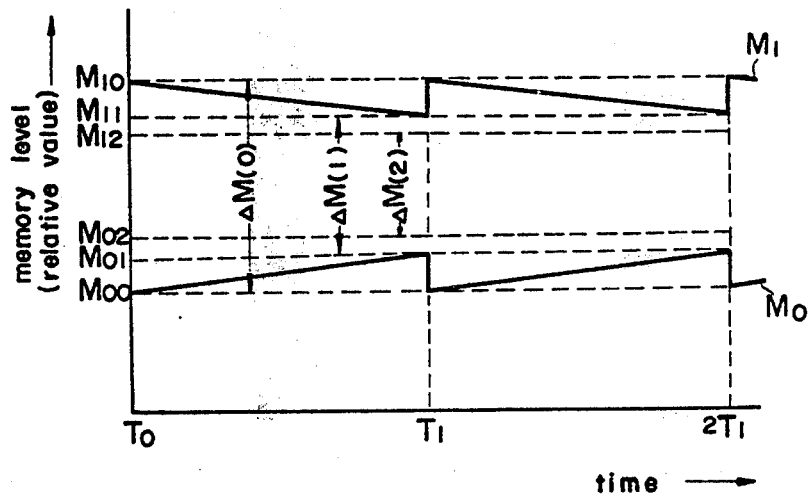
FIG. 2 shows another time chart showing change of memory levels which are reprogrammed by a non-volatile memory control circuit in accordance with the present invention.

FIG. 2 shows that the non-volatile memory devices are reprogrammed by the non-volatile memory control circuit embodying the present invention when the difference $\Delta M$ decreases to a preset value $\Delta M(1)$. The non-volatile memory devices are thus reprogrammed when the difference of the memory levels $\Delta M$ reaches $\Delta M(1)$, so that the difference of the memory levels $\Delta M$ returns to the initial value $\Delta M(0)$, which is the value immediately after the initial programming at the time T0. The memory levels of the non-volatile memory devices again gradually change after this moment in the same manner as in the previous period T0–T1, based on its time-level difference characteristics. As shown in FIG. 2, the non-volatile memory devices are reprogrammed after every same time intervals, namely at T1 and 2T1 and therefore the difference of memory levels does not at all decrease to the threshold value ΔM(2).

FIG. 3 is a block diagram showing a principal part including an interrogation circuit of the non-volatile memory control circuit of the present invention. The non-volatile memory control circuit comprises:

(i) a first non-volatile memory part 1 constituted by signal or plural number of non-volatile memory devices, (ii) a first interrogation circuit 2 which has a preset reference level of the value of threshold difference ΔM(2) shown in FIG. 1 and FIG. 2, and detects the level of an output of the first non-volatile memory part 1, (iii) a second non-volatile memory part 3 which is constituted by single or plural number of non-volatile memory devices and which is constituted to be reprogrammed at the same time when the first non-volatile memory part 1 is reprogrammed. The number of the non-volatile memory devices in the non-volatile memory part 3 is more than one or equal to one and it can be arbitrarily determined depending on that how much accuracy is required for them. And the memory data pattern can be optionally selected, in other words the levels of the memory devices are fixed to "1" and "0" or to either one of them. The selection of the memory data pattern can be determined depending on the characteristics of the memory devices.

(iv) a second interrogation circuit 4 which has a preset reference level of the difference ΔM(1), that is larger than the threshold difference value ΔM(2) shown in FIG. 1 and FIG. 2, and detects the level of an output of the second non-volatile memory part 3, and (v) an alarm circuit 5 which generates a warning signal when the memory levels "1" or "0" programmed in the second non-volatile memory part 3 are erroneously read by the second interrogation circuit 4.

The circuit of FIG. 3 elucidated as above constitutes a circuit which has a function of keeping the memory states in the first non-volatile memoty part 1 always in that which enables accurate reading of the memory state.

FIG. 4 is a block diagram of another non-volatile memory control circuit of the present invention, wherein non-volatile memory devices are automatically reprogrammed in response to an output signal from an alarm circuit 5.

The non-volatile memory control circuit of FIG. 4 includes a reprogram control circuit 6 which operates responsive to an output signal of the alarm circuit 5, an erase write circuit 7 which operates responsive to an output signal of the reprogram control circuit 6, and a memory circuit 8 which stores memory contents of a first non-volatile memory part 1 and responding with the output of the reprogram control circuit 6, to the circuit of block diagram shown in FIG. 3. In this non-volatile memory control circuit of FIG. 4, the reprogram control circuit 6 performs control operation for transferring memory contents in the first non-volatile memory part 1 to the memory circuit 8 through a first interrogation circuit 2. This transferring operation is made responding with the output signal from the alarm circuit 5.

The erase write circuit 7 operates responding with the output signal of the reprogram control circuit 6 so as to erase data in the non-volatile memory parts 1 and 3 and to write the data in the memory circuit 8 into the first non-volatile memory part 1. Then, predetermined memory levels ("1" and "0" or either one of them depending on the number of the non-volatile memory devices) are reprogrammed in the second non-volatile memory part 3. By the abovementioned operation the data stored in the first non-volatile memory part 1 are automatically reprogrammed during the time period while the difference of the memory levels is still larger than the threshold level ΔM(2), without destroying the valid memory states. Thus, the data stored in the first non-volatile memory part 1 are semipermanently retained in the valid memory states as initially programmed.

Figure 5:
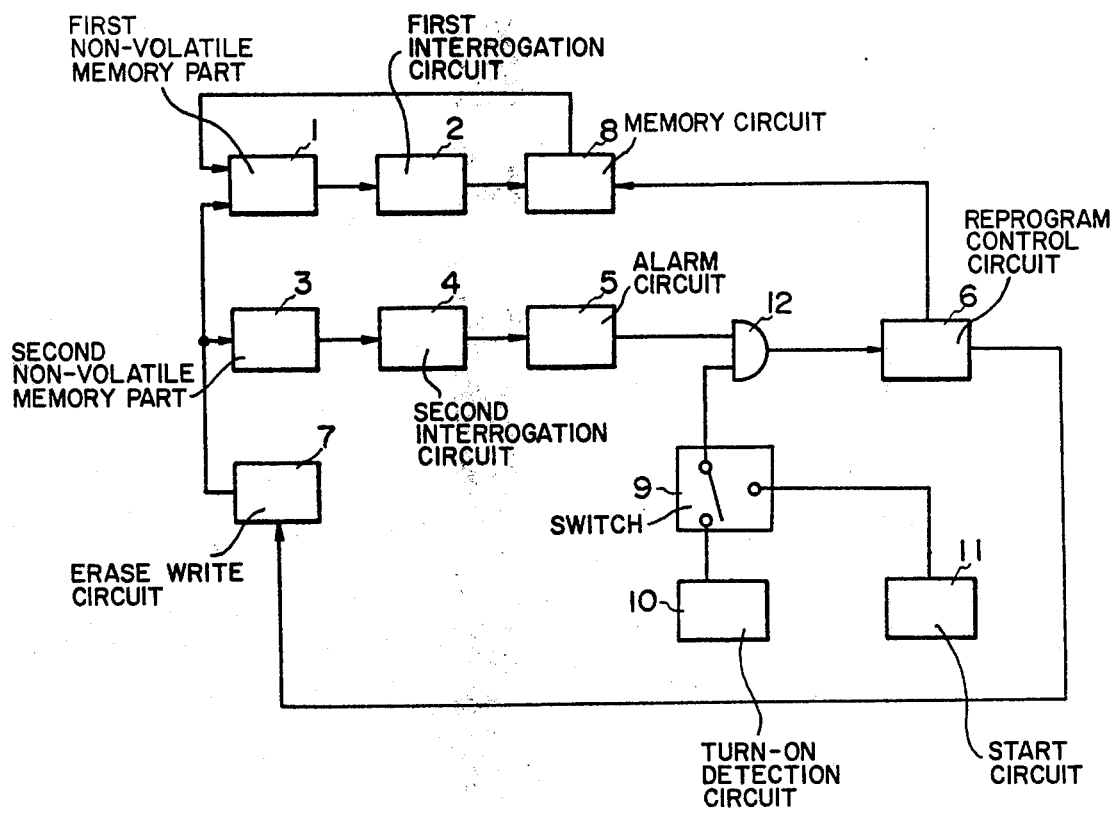

FIG. 5 is a block diagram of another non-volatile memory control circuit, wherein on top of the construction of FIG. 4, the circuit has additional parts for causing the reprogramming of the memory devices when a power source for driving the circuit is turned on. In this embodiment output signals from a turn-on detection circuit 10 or from a start circuit 11 which issues a triggering signal for reprogramming operation are selected by a switch 9. The operation of the reprogram control circuit 6 is controlled by an output signal of an AND gate 12 which receives an output signal selected by the switch 9 and an output signal of the alarm circuit 5.

These circuits are so designed that the non-volatile memory divices are not necessarily reprogrammed immediately after every issuing of output signals from the alarm circuit 5 during an operation of an apparatus including the abovementioned circuits. There is no inconvenience that the operation of the apparatus stops or paralized for a moment due to the reprogramming operation for the non-volatile memory devices.

This situation is elucidated referring to FIG. 5. When the switch 9 is switched to the side to transmit the output signal of the turn-on detection circuit 10 to the AND gate 12, the reprogramming of the non-volatile memory devices is automatically executed if the alarm circuit 5 issues the output signal and besides the power source is turned on. When the switch 9 is switched to the side to transmit the output signal of the start circuit 11 to the AND gate 12, the reprogramming operation can be manually executed at any desired time during the while the alarm circuit 5 is issuing the output signal.

Figure 6:
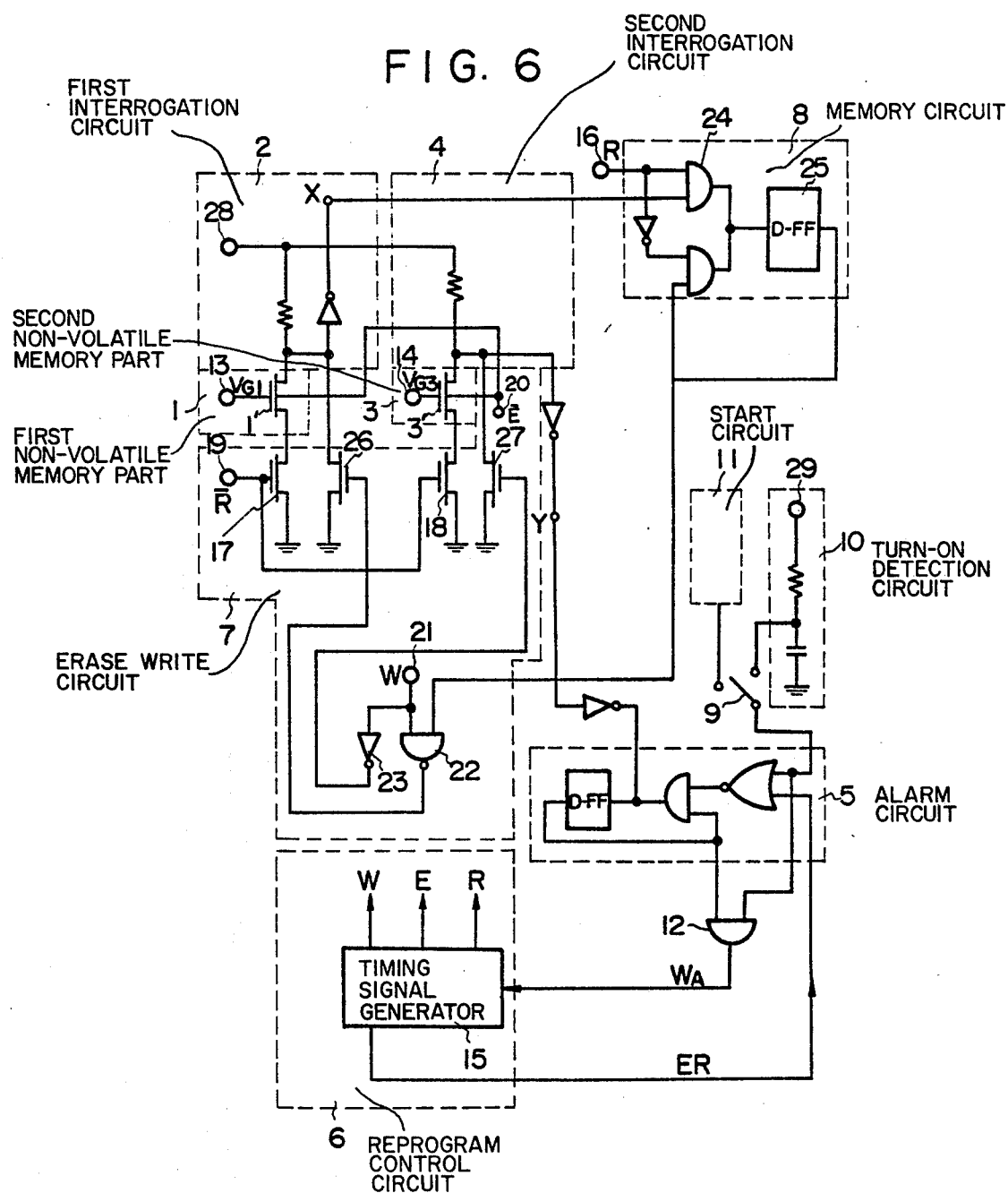
FIG. 6 is a circuit diagram showing one embodiment of a non-volatile memory control circuit for non-volatile memory devices in accordance with the present invention.
Figure 7:
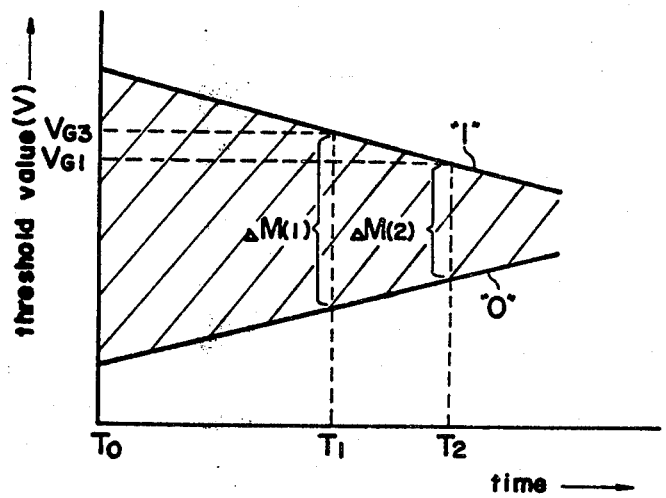
FIG. 7 is a time chart showing relationships between time and threshold voltage, and showing a scope indicated by hatching lines, within which scope the memory levels "1" and "0" are correctly read out by the gate voltage $V_{G1}$ and $V_{G3}$.

FIG. 6 is a schematic diagram of a specific example of the abovementioned non-volatile memory control circuit shown in block diagram in FIG. 5. In the circuit of FIG. 6, two non-volatile memory parts 1 and 3 are respectively constituted by using single non-volatile memory devices 1' and 3'. The non-volatile memory device 1' and the non-volatile memory device 3' used in this circuit are MNOS (metal-silicon nitride-silicon dioxide-semiconductor) memory devices. Other transistors are p-channel MOS FET's. The MNOS memory devices have a threshold voltage to gate voltage hysteresis characteristics. Data can be stored by applying gate voltage and later they can be erased and reprogrammed electrically.

In the circuit of FIG. 6 the specified voltage $V_{G1}$ and $V_{G3}$ are respectively applied to the gates of the non-volatile memory devices 1' and 3' thereby making the MNOS memory devices turn on or turn off.

The non-volatile memory devices 1' and 3' are so designed that, when both non-volatile memory devices 1' and 3' have the memory level of "1", the time period during which the memory level "1" can be correctly read out by the gate voltage of $V_{G1}$ at the gate terminal 13 is the time period from T0 to T2, and the time period during which the memory level "1" can be correctly read out by the gate voltage $V_{G3}$ at the gate terminal 14 is the time period from T0 to T1. This means that the memory level in the non-volatile memory 3' is erroneously read out as "0" after the time T1.

Then, the output of the interrogation circuit 4 causes the alarm circuit 5, which has been previously reset by the turning-on of the power source, to set and issue an alarm signal WA. This alarm signal WA is given to the reprogram control circuit 6, which lets a timing signal generator 15 operate to produce a sequence of a read-out signal R, an erase signal E and a write-in signal W, which are to be applied to the terminals 19 and 16, 20 and 21, respectively with the belowmentioned logic levels.

FIG. 8 (a) to FIG. 8 (j) are timing diagrams of the logic levels and the voltages of various parts of the circuit shown in FIG. 6. FIG. 8 (a) shows an output signal of a turn-on detection circuit 10. FIG. 8 (b) shows the output signal WA of the alarm circuit 5. FIG. 8 (c) shows the gate voltage $V_{G1}$ of the non-volatile memory 1'. FIG. 8 (d) shows the gate voltage $V_{G3}$ of the non-volatile memory 3'. FIG. 8 (e) shows an output signal at a terminal X of the first interrogation circuit 2. FIG. 8 (f) shows an output signal at a terminal Y of the second interrogation circuit 4. FIG. 8 (g) shows the read-out signal R, FIG. 8 (h) the erase signal E, FIG. 8 (i) the write-in signal W and FIG. 8 (j) an end signal ER to indicate an end of memory reprogramming, respectively. The dotted lines in FIG. 8 (e) and FIG. 8 (f) indicate that their logic levels can be arbitrary during erasing and writing-in operation.

The read-out signal R generated by the timing signal generator 15 is applied to a memory circuit 8 through the terminal 16, and an inverted signal $\overline{R}$ of the read-out signal R is applied to the gate of a transistor for read-out 17 of the first interrogation circuit 2 and to the gate of a transistor for read-out 18 of the second interrogation circuit 4 through the terminal 19. An inverted signal $\overline{E}$ of the erase signal E is applied to the substrates of the non-volatile memory devices 1' and 3' through the terminal 20. The write-in signal W is applied to a NAND gate 22 and an inverter 23 through the terminal 21. The end signal ER for memory reprogramming is applied to the alarm circuit 5. A power source is connected to terminals 28 and 29.

The circuit operation by these signals is now elucidated. When a pulse r of the read-out signal R of FIG. 8 (g) is applied to the terminal 16, the memory level of the non-volatile memory 1' is transmitted to a delayed flip flop (D-FF) 25 through the terminal X and an AND gate 24. Then, a pulse e of the erase signal E is generated after the fall-down of the pulse r of the read-out signal R as shown in FIG. 8 (h). The inverted signal $\overline{E}$ is applied to the terminal 20 after the abovementioned transmission of the memory state. As a result, the memories of both non-volatile memory devices 1' and 3' are erased after the completion of the transmission of the memory state.

Then, after the erasing, the pulse w of the write-in signal W is generated and memory contents of the D-FF 25 are written into the non-volatile memory 1' through the NAND gate 22 and a writing transistor 26. And also, the memory level "1" is written into the non-volatile memory 3' through the inverter 23 and another writing transistor 27. During this write-in operation, the gate potentials of the non-volatile memory devices 1' and 3' become to those of the write-in potentials. After the abovementioned sequence of these timing signals is generated, the pulse er of the end signal ER for memory reprogramming is finally generated, thereby resetting the alarm circuit 5, and completing the whole operation for memory reprogramming.

As elucidated above, memory levels which have considerably decayed at the time T1 from the initial level, are rewritten to the initial "1" level by means of the several amplifier stages.

The operation of the circuit of FIG. 6 can be made to reprogram the memory states when the power is turned on. By using a switch linked to a power source turn-off switch in place of the power source turn-on detection circuit of the previous example and by introducing a suitable time delay circuit which delays an actual turn-off of the power source to be after the time of the mechanical turn-off of the linked switch by a specified time period, it is also possible to reprogram the memory data when the power source is turned off.

When plural number of memory devices are formed in the device fabrication, their electrical characteristics may be slightly different from each other. In case that the memory devices in the second non-volatile memory part 3 have the memory characteristics not identical to, but similar to those of the memory devices in the first non-volatile memory part 1, it is possible to detect the memory levels more precisely by detecting the memory level of a memory device in which the memory level first reaches a specified level (e.g. M11) which is different from the initially memorized level.

The data pattern of the reprogramming "1" and "0" consists of or either one of them and this pattern is always same one controlled by pulse signals to be applied to the gate of the memory devices.

As elucidated above, according to the non-volatile memory control circuit of the present invention, memory states of the non-volatile memory devices can be held in valid states semipermanently and circuit condition of the non-volatile memory parts including non-volatile memory devices is kept in right circuit condition.

We claim:

1. A non-volatile memory control circuit comprising:
   first non-volatile memory means for memorizing data,
   second non-volatile memory means for storing a predetermined data pattern,
   first and second interrogation circuits for detecting changes of memory levels of said first and said second non-volatile memory means, respectively, and
   an alarm circuit for generating an alarm signal when the memory data pattern of said second non-volatile memory means as detected by said second interrogation circuit is different from said predetermined data pattern.

2. A non-volatile memory control circuit in accordance with claim 1 further comprising:
   a reprogram control circuit responsive to said alarm signal for generating a control signal for reprogramming the memory levels of said first and said second non-volatile memory means, a memory circuit responsive to said control signal for memorizing the memory levels of said first non-volatile memory means, and an erase write circuit for erasing or writing the memory levels of said first and said second non-volatile memory means responsive to said control signal from said reprogram circuit.

3. A non-volatile memory control circuit in accordance with claim 2 further comprising:
a power turn-on detection circuit, and
a logic gate for coupling said alarm signal to said reprogram control circuit only in the presence of an output of said power turn-on detection circuit.

4. A non-volatile memory control circuit in accordance with claim 2 further comprising:
a power switch turn-off operation detection circuit,
a delay circuit for holding the power source voltage for a predetermined time after a turn-off operation of said power switch, and
a logic gate for coupling said alarm signal to said reprogram control circuit only in the presence of an output of said power turn-off operation detection circuit.

5. A non-volatile control circuit in accordance with claim 2 further comprising:
a manually operable start circuit for providing signals for reprogramming operation order to said reprogram control circuit 6. A non-volatile memory control circuit in accordance with claim 2 further comprising:
a power turn-on detection circuit and a manually operable start circuit for providing signals for reprogramming operation order to said reprogram control circuit.

7. A non-volatile memory control circuit in accordance with claim 2 further comprising:
a power turn-off detection circuit and a manually operable start circuit for providing a signal for reprogramming operation order to said reprogram control circuit.

8. A non-volatile memory control circuit in accordance with claim 1, wherein the threshold levels of said interrogation circuits are selected such that the time period for reaching threshold detectable memory level of said second interrogation circuit is shorter than that of said first interrogation circuit.

9. A non-volatile memory control circuit comprising:
a first non-volatile memory means for memorizing data consisting of two time-decaying memory levels, said two time-decaying memory levels starting from two predetermined memory levels,
a second non-volatile memory means for storing a predetermined memory data pattern consisting of said two time-decaying memory levels initially,
a first interrogating circuit having a first predetermined threshold value determined by the difference between said two time-decaying memory levels for detecting change of said two time-decaying memory levels of said second non-volatile memory part,
a second interrogation circuit having a second predetermined threshold value determined by the difference between said two time-decaying memory levels and which detects change of said two time-decaying memory levels of said second non-volatile memory part, and an alarm circuit for generating an alarm signal when the memory data pattern of said second non-volatile memory part as detected by said second predetermined value of said second interrogation circuit is different from said predetermined data pattern.

10. A non-volatile memory control circuit according to claim 9 further comprising:
a reprogram control circuit for generating in response to said alarm signal a control signal for reprogramming the memory data of said first and said second non-volatile memory means to said predetermined memory levels,
a memory circuit for memorizing in response to said control signal the memory data of said first non-volatile memory part, and
an erase write circuit for erasing or writing the memory data of said first and said second non-volatile memory parts in response to said control signal from said reprogram circuit.

11. A non-volatile memory control circuit according to claim 10 further comprising:
a power turn-on detection circuit, and a logic gate for coupling an output signal of said alarm circuit to said reprogram control circuit only when an output of said power turn-on detection circuit is present.

12. A non-volatile memory control circuit according to claim 10 further comprising:
a power switch turn-off operation detection circuit, and
a delay circuit for holding the power source voltage for a specified time after a turn-off operation of said power switch, and a logic gate for coupling said alarm signal to said reprogram control circuit only when an output of said power turn-off operation detection circuit is present.

13. A non-volatile control circuit according to claim 10 further comprising:
a manually operable start circuit for providing signals for a reprogramming operation order to said reprogram control circuit.

14. A non-volatile memory control circuit according to claim 10 further comprising:
a power turn-on detection circuit and a manually operable start circuit for providing signals for a reprogramming operation order to said reprogram control circuit.

15. A non-volatile memory control circuit according to claim 10 further comprising:
a power turn-off detection circuit and a manually operable start circuit for providing a signal for a reprogramming operation order to said reprogram control circuit.

16. A non-volatile memory control circuit according to claim 9, wherein the threshold levels of said interrogation circuits are selected such that a time period for reaching said second predetermined value of said second interrogation circuit is shorter than that for reaching said first predetermined threshold value of said first interrogation circuit.

* * * * *